(12) United States Patent
Yokoyama

(10) Patent No.: US 11,653,571 B2
(45) Date of Patent: May 16, 2023

(54) RESONANCE DEVICE, OSCILLATOR, RESONANCE MODULE, ELECTRONIC DEVICE AND VEHICLE

(71) Applicant: SEIKO EPSON CORPORATION, Tokyo (JP)

(72) Inventor: Yoshihiko Yokoyama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 425 days.

(21) Appl. No.: 16/828,631

(22) Filed: Mar. 24, 2020

(65) Prior Publication Data

US 2020/0313070 A1 Oct. 1, 2020

(30) Foreign Application Priority Data

Mar. 25, 2019 (JP) .............................. JP2019-057427

(51) Int. Cl.
| | | |
|---|---|---|
| *H03B 5/32* | (2006.01) | |
| *H01L 41/053* | (2006.01) | |
| *H01L 41/09* | (2006.01) | |
| *H03H 9/10* | (2006.01) | |
| *H03H 9/19* | (2006.01) | |
| *H01L 41/18* | (2006.01) | |
| *H01L 41/047* | (2006.01) | |
| *H01L 41/312* | (2013.01) | |

(52) U.S. Cl.
CPC ............ *H01L 41/18* (2013.01); *H01L 41/047* (2013.01); *H01L 41/053* (2013.01); *H01L 41/09* (2013.01); *H01L 41/312* (2013.01); *H03B 5/32* (2013.01); *H03H 9/10* (2013.01); *H03H 9/19* (2013.01)

(58) Field of Classification Search
CPC ..... H01L 41/047; H01L 41/053; H01L 41/09; H01L 41/18; H01L 41/23; H01L 41/31; H01L 41/311; H01L 41/312; H03B 5/30; H03B 5/32; H03H 9/0547; H03H 9/10; H03H 9/172; H03H 9/173; H03H 9/19
See application file for complete search history.

(56) References Cited

U.S. PATENT DOCUMENTS 6,726,372 B1 * 4/2004 Sherrer ................ G02B 6/3676
385/83
2011/0221309 A1 9/2011 Umeki
(Continued)

FOREIGN PATENT DOCUMENTS

| JP | H04-284006 | 10/1992 |
|---|---|---|
| JP | H05-206307 | 8/1993 |

(Continued)

*Primary Examiner* — Levi Gannon

(74) *Attorney, Agent, or Firm* — Workman Nydegger

(57) ABSTRACT

A resonance device includes a first substrate formed of a semiconductor material or a glass material and having a recess which has an opening in a first main surface, a second substrate bonded to the first main surface and configured to close the opening of the recess, and a resonator element housed in the recess. An inner surface of the recess includes a side surface, a bottom surface, and a connection surface connecting the side surface and the bottom surface, the connection surface is a curved surface, and L1<L2, wherein L1 is a length of the connection surface in a first direction, and L2 is a length in a second direction orthogonal to the first direction.

9 Claims, 10 Drawing Sheets

(56) References Cited

U.S. PATENT DOCUMENTS

| | | | |
|---|---|---|---|
| 2012/0236384 A1* | 9/2012 | Mizoguchi | G02B 26/105 |
| | | | 359/876 |
| 2014/0191617 A1 | 7/2014 | Ohashi et al. | |
| 2014/0346930 A1* | 11/2014 | Kohda | H01L 41/0533 |
| | | | 216/41 |
| 2015/0123742 A1* | 5/2015 | Naito | H03H 9/17 |
| | | | 331/158 |
| 2018/0076792 A1* | 3/2018 | Asai | H03H 9/177 |
| 2018/0167050 A1 | 6/2018 | Yoshii et al. | |

FOREIGN PATENT DOCUMENTS

| | | | | |
|---|---|---|---|---|
| JP | 2009-17454 | * | 1/2009 | H03H 9/02 |
| JP | 2010-081415 | | 4/2010 | |
| JP | 2011-087075 | | 4/2011 | |
| JP | 2011-188308 | | 9/2011 | |
| JP | 2012-075053 | | 4/2012 | |
| JP | 2013-074517 | | 4/2013 | |
| JP | 2018-098599 | | 6/2018 | |
| WO | 2013-027760 | | 2/2013 | |

\* cited by examiner

RESONANCE DEVICE, OSCILLATOR, RESONANCE MODULE, ELECTRONIC DEVICE AND VEHICLE

The present application is based on, and claims priority from JP Application Serial Number 2019-057427, filed Mar. 25, 2019, the disclosure of which is hereby incorporated by reference herein in its entirety.

BACKGROUND

1. Technical Field

The present disclosure relates to a resonance device, an oscillator, a resonance module, an electronic device and a vehicle.

2. Related Art

JP-A-2011-87075 or JP-A-4-284006 describes a resonance device that includes a lid having a recess, a base substrate configured to close an opening of the recess and bonded to the lid, and a resonator element housed in the recess and fixed to the base substrate.

However, in the resonance device described in JP-A-2011-87075 or JP-A-4-284006, when the lid is formed of a material that does not have high mechanical strength, such as glass or silicon, depending on a shape between a side surface and a bottom surface of the recess formed in the lid, there is a possibility that stress concentrates on a corresponding portion to generate cracks and a characteristic of the resonance device deteriorates.

SUMMARY

A resonance device according to this application example includes a first substrate formed of a semiconductor material or a glass material and having a recess opening in a first main surface, a second substrate bonded to the first main surface and configured to close an opening of the recess, and a resonator element housed in the recess. An inner surface of the recess includes a side surface, a bottom surface, and a connection surface connecting the side surface and the bottom surface, the connection surface is a curved surface, and L1<L2, wherein L1 is a length in a first direction, which is a thickness direction of the first substrate, of the connection surface, and L2 is a length in a second direction orthogonal to the first direction.

DESCRIPTION OF EXEMPLARY EMBODIMENTS

Hereinafter, a resonance device, an oscillator, a resonance module, an electronic device and a vehicle according to this application example will be described in detail based on embodiments shown in accompanying drawings.

First Embodiment

Figure 1:
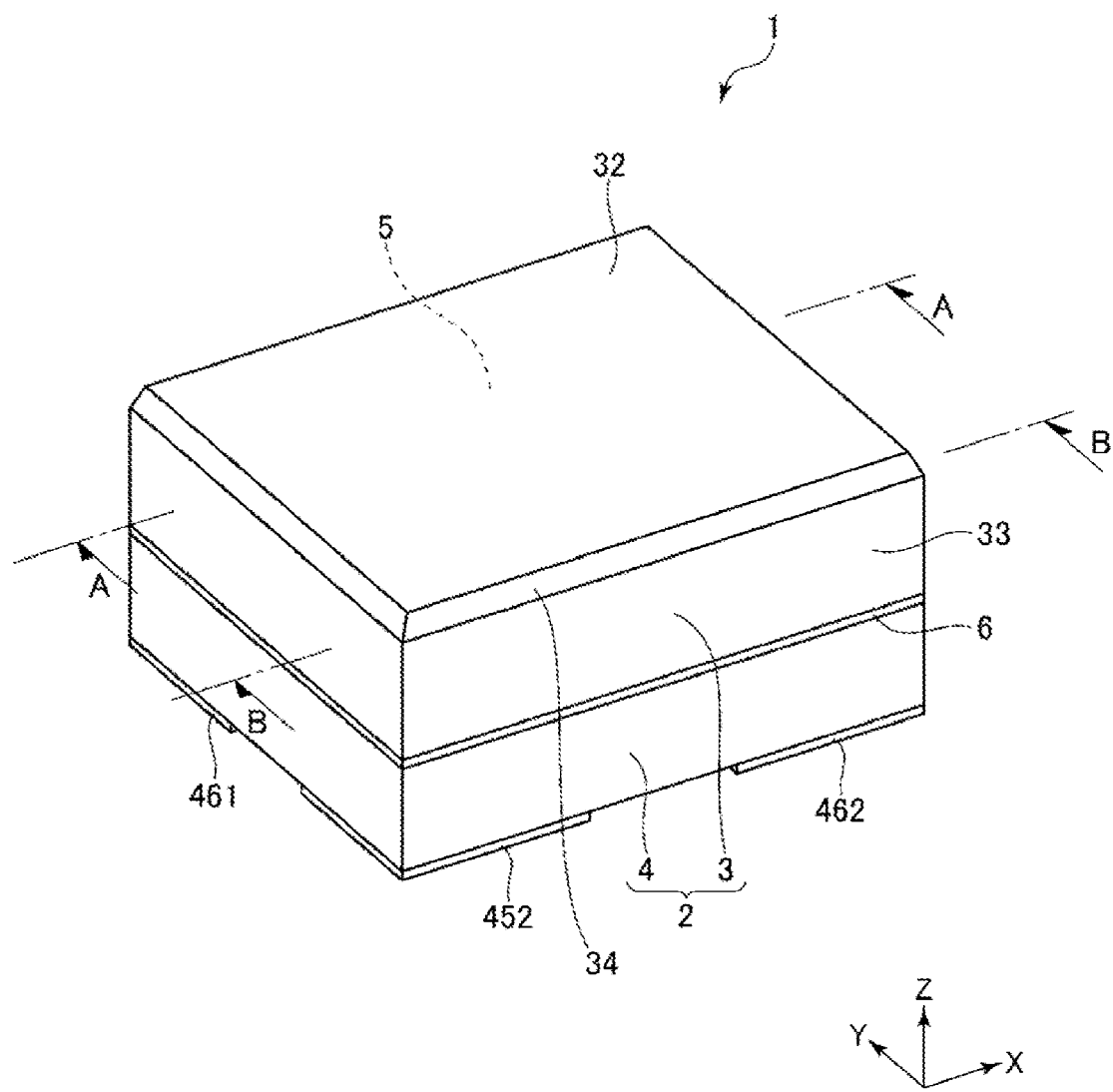
FIG. 1 is a perspective view showing a resonance device according to a first embodiment.
Figure 2:
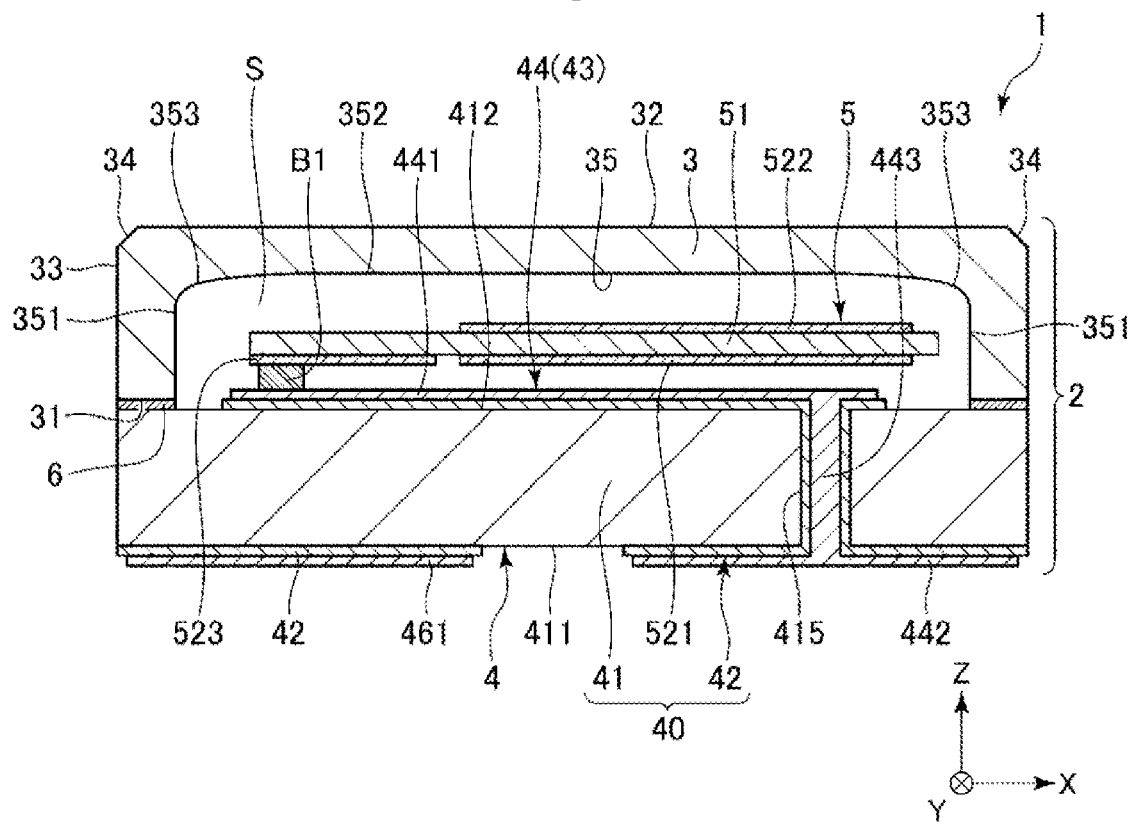
FIG. 2 is a cross-sectional view taken along a line A-A in FIG. 1.
Figure 3:
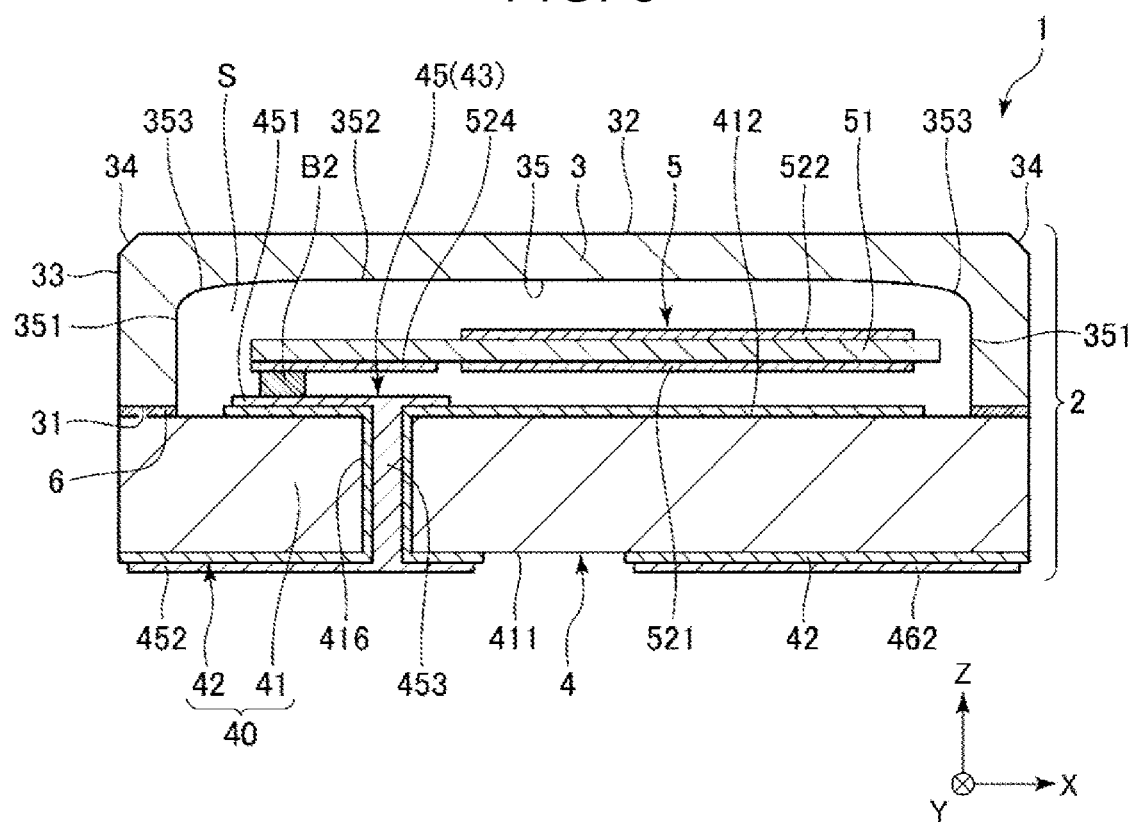
FIG. 3 is a cross-sectional view taken along a line B-B in FIG. 1.
Figure 4:
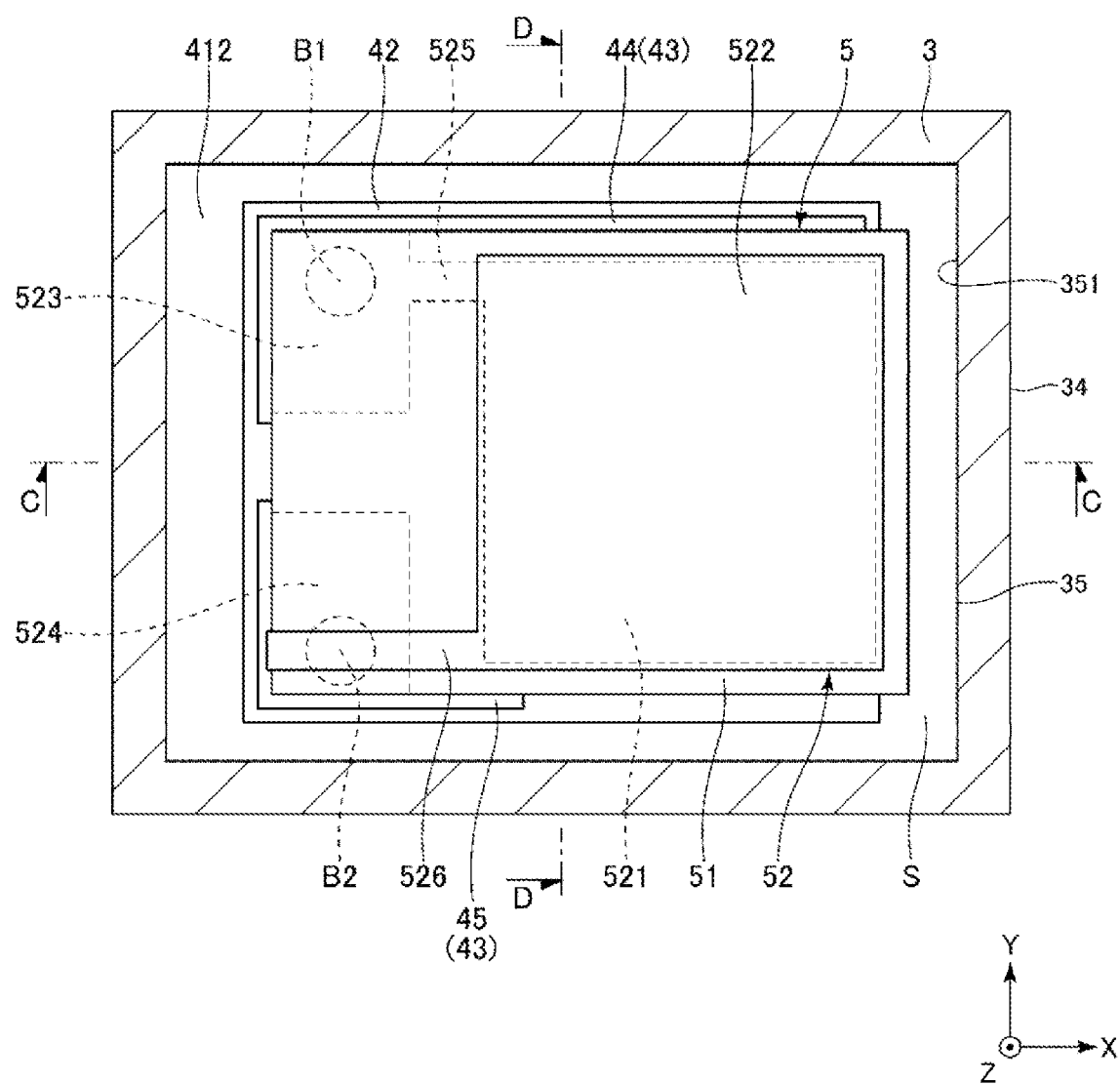
FIG. 4 is a plan view showing a resonator element included in the resonance device of FIG. 1.
Figure 5:
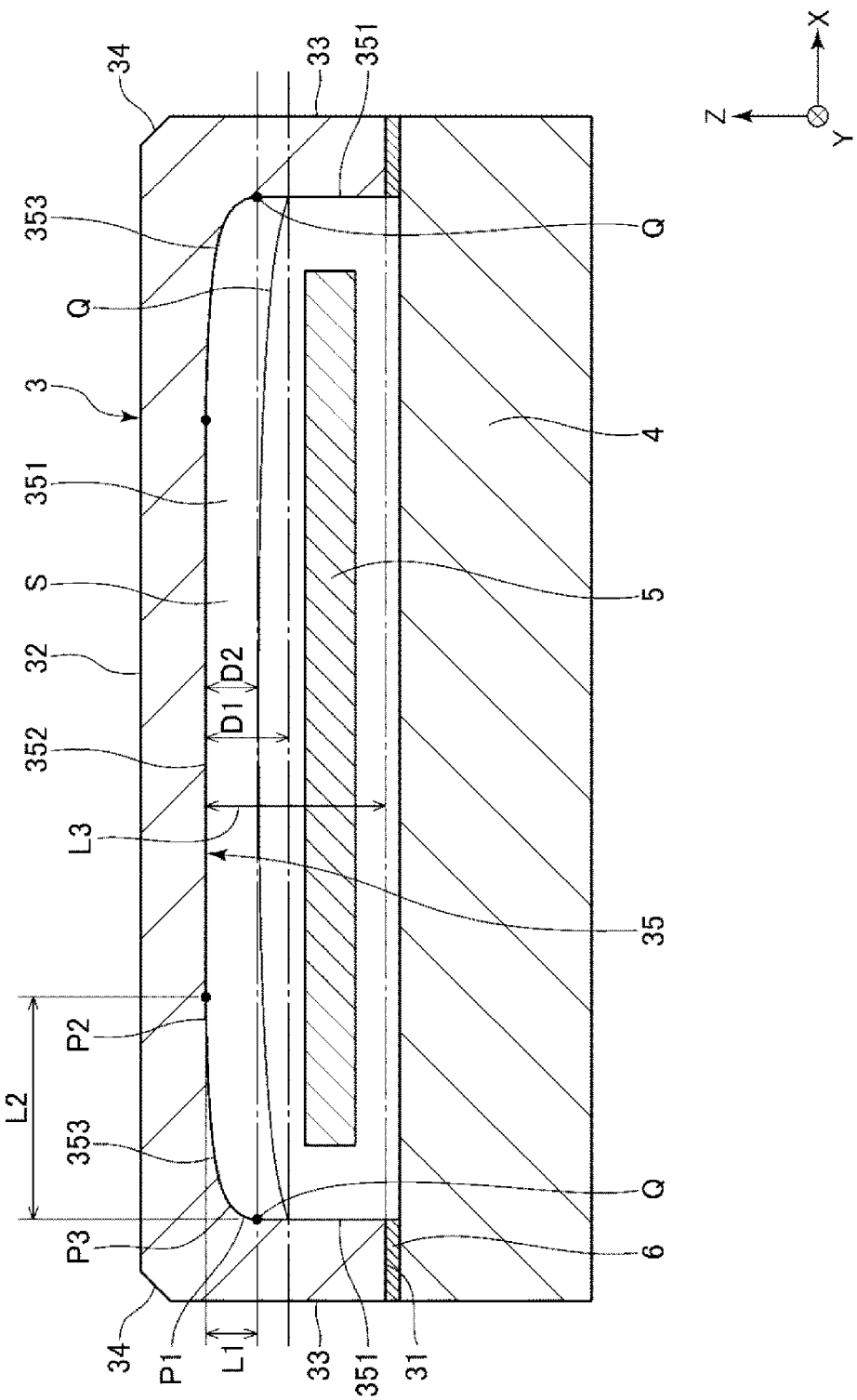
FIG. 5 is a cross-sectional view taken along a line C-C in FIG. 4.
Figure 6:
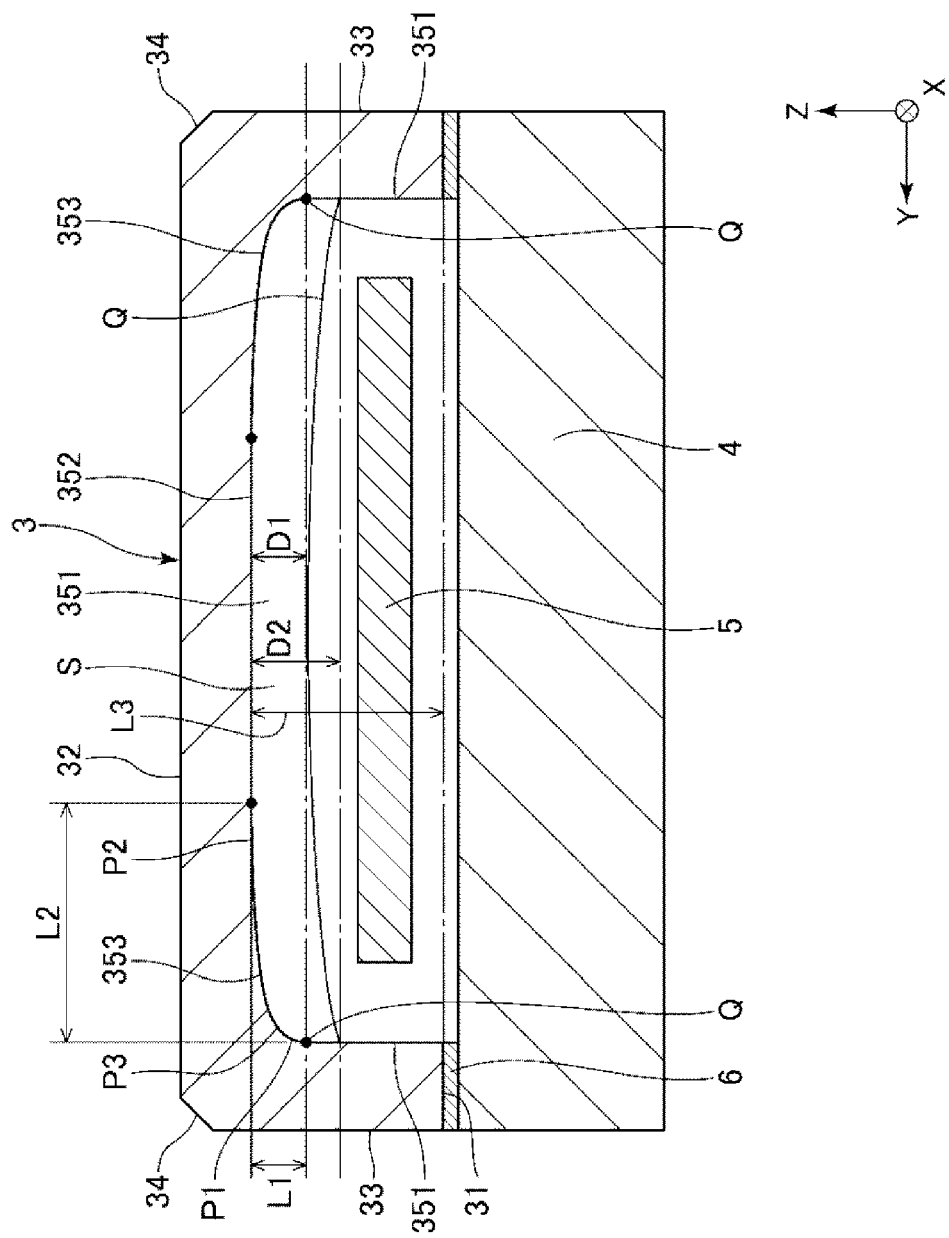
FIG. 6 is a cross-sectional view taken along a line D-D in FIG. 4.
Figure 7:
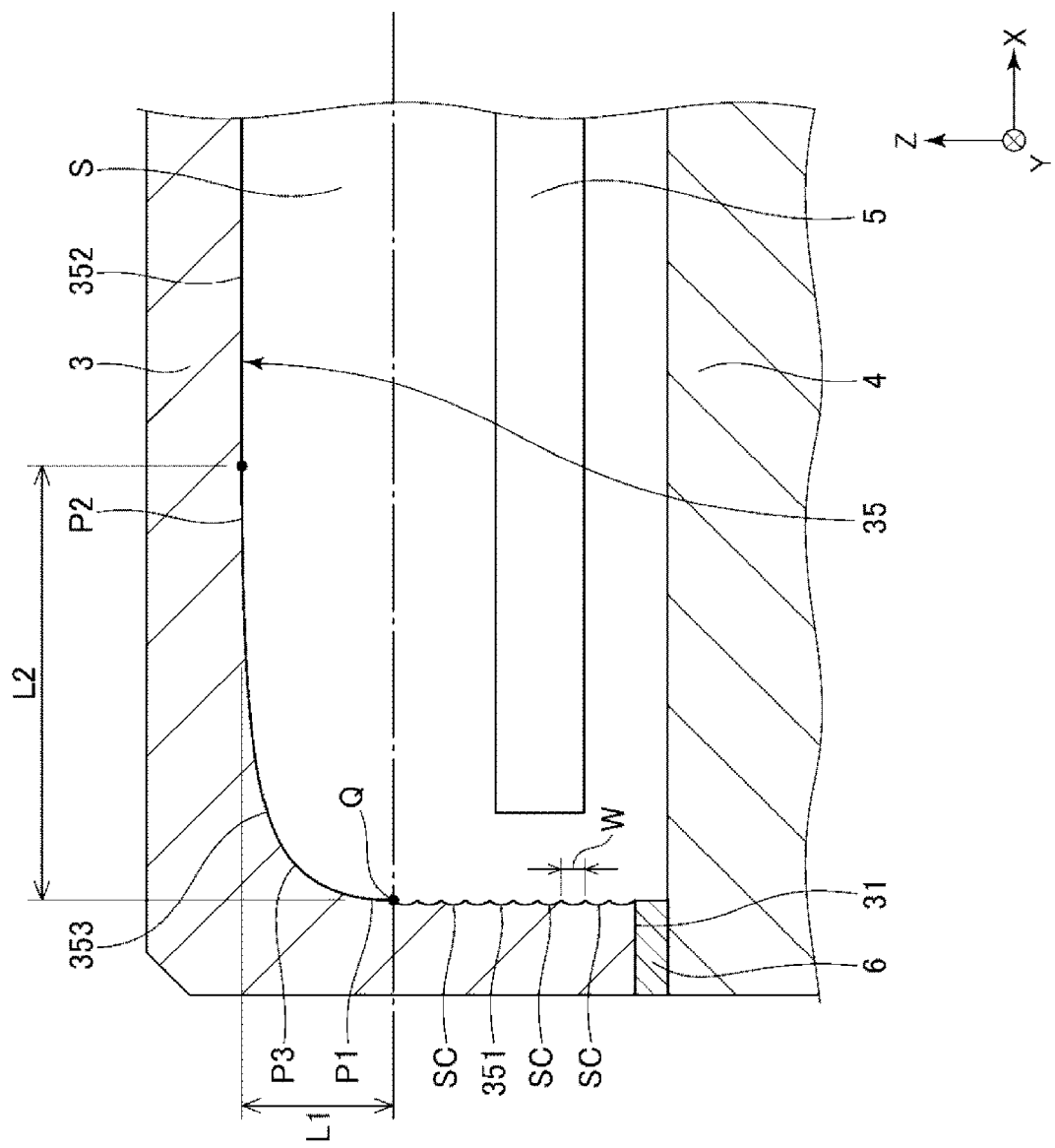
FIG. 7 is an enlarged cross-sectional view showing a lid included in the resonance device of FIG. 1.

FIG. 1 is a perspective view showing a resonance device according to a first embodiment. FIG. 2 is a cross-sectional view taken along a line A-A in FIG. 1. FIG. 3 is a cross-sectional view taken along a line B-B in FIG. 1. FIG. 4 is a plan view showing a resonator element included in the resonance device of FIG. 1. FIG. 5 is a cross-sectional view taken along a line C-C in FIG. 4. FIG. 6 is a cross-sectional view taken along a line D-D in FIG. 4. FIG. 7 is an enlarged cross-sectional view showing a lid included in the resonance device of FIG. 1. For convenience of illustration, in each figure, three axes orthogonal to each other are shown as an X axis, a Y axis, and a Z axis. In addition, an arrow tip side of each axis is also referred to as a "plus side", and an opposite side is also referred to as a "minus side". Further, a plus side of the Z axis is also referred to as "up", and a minus side is also referred to as "down". Furthermore, a plan view along the Z axis is also simply referred to as a "plan view".

As shown in FIG. 1, a resonance device 1 includes a resonator element 5, and a package 2 configured to house the resonator element 5. Further, as shown in FIGS. 2 and 3, the package 2 includes a box-shaped lid 3, as a first substrate, having a recess 35 configured to house the resonator element 5, and a plate-shaped base 4, as a second substrate, configured to close an opening of the recess 35 and bonded to the lid 3. The opening of the recess 35 is closed by the base 4, thereby forming a housing space S for housing the resonator element 5. The housing space S is airtight and is in a reduced pressure state, preferably in a state closer to a vacuum. However, an atmosphere of the housing space S is not particularly limited, and may be, for example, an atmosphere filled with an inert gas such as nitrogen and Ar, or an atmosphere in an atmospheric pressure state or a pressurized state instead of the reduced pressure state.

The base 4 includes a substrate 40 having an insulating property and an electrode 43 disposed on the substrate 40. The substrate 40 includes a base substrate 41 and an insulating film 42 disposed on a surface of the base substrate 41. The base substrate 41 is in a plate shape and having a rectangular shape in a plan view, and has a lower surface 411 and an upper surface 412 in a front-back relationship. The base substrate 41 includes two through holes 415 and 416 that penetrate the upper surface 412 and the lower surface 411.

A constituent material of the base substrate 41 is a semiconductor material. The semiconductor material is not particularly limited, and for example, silicon, germanium, or a compound semiconductor material such as GaP, GaAs, and InP can be used. By using the semiconductor material as the constituent material of the base substrate 41, the resonance device 1 can be formed by a semiconductor process. Therefore, the resonance device 1 can be manufactured with a high accuracy and miniaturization thereof can be achieved. For example, a semiconductor circuit such as an oscillation circuit can be formed on the base 4, and the base 4 can be effectively used. In particular, in this embodiment, silicon is used as the constituent material of the base substrate 41. Accordingly, the base substrate 41 is easily obtained and inexpensive.

However, the constituent material of the base substrate 41 is not limited to the semiconductor material, and for example, various ceramic materials, or various glass materials can be used. When a ceramic material or a glass material is used, the insulating film 42 can be omitted since the base substrate 41 itself has an insulating property.

The insulating film 42 is disposed on the surface of the base substrate 41. However, the insulating film 42 is not disposed at an outer edge portion of the upper surface 412, that is, at a bonding portion with the lid 3. Therefore, the outer edge portion of the upper surface 412 is exposed from the insulating film 42. The insulating film 42 is formed of a silicon oxide film ($SiO_2$ film). A method for forming the insulating film 42 is not particularly limited. For example, the insulating film 42 may be formed by thermally oxidizing the surface of the base substrate 41 or by plasma CVD using TEOS (tetraethoxysilane). However, the insulating film 42 is not particularly limited. For example, the insulating film 42 may be formed of an insulating resin material such as polyimide, or may be formed of a composite in which different materials are stacked.

The electrode 43 is disposed on the insulating film 42. The electrode 43 includes a first wiring 44 and a second wiring 45 that are disposed apart from each other. The first wiring 44 includes an internal terminal 441 disposed on an upper surface of the substrate 40 and facing the housing space S, an external terminal 442 disposed on a lower surface of the substrate 40 and facing an outside of the package 2, and a through electrode 443 disposed in the through hole 415 and electrically coupling the internal terminal 441 and the external terminal 442.

Similarly, the second wiring 45 includes an internal terminal 451 disposed on the upper surface of the substrate 40 and facing the housing space S, an external terminal 452 disposed on the lower surface of the substrate 40 and facing the outside of the package 2, and a through electrode 453 disposed in the through hole 416 and electrically coupling the internal terminal 451 and the external terminal 452.

The electrode 43 includes two dummy terminals 461 and 462 disposed on the lower surface of the substrate 40. The dummy terminals 461 and 462 do not play an electrical role, and are provided, for example, to increase bonding strength between the package 2 and an object. However, the role of the dummy terminals 461 and 462 is not limited thereto.

The lid 3 has a lower surface 31 (first main surface), an upper surface 32 (second main surface) in a front-back relation with the lower surface 31, an outer peripheral surface 33 connecting the lower surface 31 and the upper surface 32, and an inclined surface 34 located between the upper surface 32 and the outer peripheral surface 33 and inclined with respect to the upper surface 32 and the outer peripheral surface 33. In other words, a corner between the upper surface 32 and the outer peripheral surface 33 is chamfered. Accordingly, a stress concentration on a corresponding portion is prevented and mechanical strength of the lid 3 is increased. In this embodiment, the inclined surface 34 is a planar surface, but the present disclosure is not limited thereto, and the inclined surface 34 may be a curved surface. In this embodiment, the inclined surface 34 is formed over an entire periphery of the upper surface 32, but the present disclosure is not limited thereto, and the inclined surface 34 may be formed only on a part of an outer periphery of the upper surface 32. The inclined surface 34 may be omitted.

The lid 3 has a box shape including a bottomed recess 35 open on the lower surface 31. A constituent material of the lid 3 as described above is a semiconductor material. The semiconductor material is not particularly limited, and for example, silicon, germanium, or a compound semiconductor material such as GaP, GaAs, and InP can be used. By using the semiconductor material as the constituent material of the lid 3, the resonance device 1 can be formed by a semiconductor process. Therefore, the resonance device 1 can be manufactured with the high accuracy and miniaturization thereof can be achieved. In particular, in this embodiment, silicon is used as the constituent material of the lid 3. Accordingly, the lid 3 is easily obtained and inexpensive. The base substrate 41 and the lid 3 can be formed of the same material, and a difference between thermal expansion coefficients can be made substantially zero. Therefore, generation of a thermal stress due to thermal expansion is prevented, and the resonance device 1 having an excellent resonance characteristic is obtained.

However, the constituent material of the lid 3 is not limited to the semiconductor material, and various glass materials can also be used. When a glass material having optical transparency is used as the constituent material of the lid 3, after the resonance device 1 is manufactured, the resonator element 5 can be irradiated with a laser through the lid 3 to remove a part of an excitation electrode 522, and a frequency of the resonator element 5 can be adjusted.

The lid 3 as described above is indirectly bonded to the upper surface 412 of the base substrate 41 via a bonding member 6 on the lower surface 31. In this embodiment, the lid 3 and the base substrate 41 are bonded by diffusion bonding using diffusion between metals among the indirect bonding. Specifically, a metal film is provided on the lower surface 31 of the lid 3, and a metal film is provided on the upper surface 412 of the base substrate 41. The metal films are diffusion bonded together to form the bonding member 6, and the lid 3 and the base substrate 41 are bonded via the bonding member 6. However, a bonding method is not limited thereto. For example, the lower surface 31 of the lid 3 and the upper surface 412 of the base substrate 41 may be irradiated with an inert gas such as argon gas to activate these surfaces, and the lower surface 31 and the upper surface 412 may be directly bonded. Further, various bonding members, such as a resin adhesive and a low melting glass may be used in the bonding.

As shown in FIG. 4, the resonator element 5 includes a resonator substrate 51 and an electrode 52 disposed on a surface of the resonator substrate 51. The resonator substrate 51 has a thickness-shear resonation mode, and is formed from an AT-cut quartz crystal substrate in this embodiment. The AT-cut quartz crystal substrate has a third-order frequency temperature characteristic and becomes the resonator element 5 having an excellent temperature characteristic.

The electrode 52 includes an excitation electrode 521 disposed on a lower surface of the resonator substrate 51 and the excitation electrode 522 disposed on an upper surface so as to face the excitation electrode 521 with the resonator substrate 51 interposed therebetween. The electrode 52 includes a pair of terminals 523 and 524 disposed on the lower surface of the resonator substrate 51, a wiring 525 electrically coupling the terminal 523 and the excitation electrode 521, and a wiring 526 electrically coupling the terminal 524 and the excitation electrode 522.

A configuration of the resonator element 5 is not limited to the above configuration. For example, the resonator element 5 may be a mesa type in which a resonator region sandwiched between the excitation electrodes 521 and 522 protrudes from a periphery, or conversely, a reverse mesa type in which the resonator region is recessed from the periphery. A bevel processing for grinding a periphery of the resonator substrate 51 or a convex processing for making the upper surface and the lower surface as convex curved surfaces may be performed.

The resonator element 5 is not limited to one that resonates in the thickness-shear resonation mode, and for example, a tuning-fork type resonator element in which two vibrating arms make tuning-fork resonation in an in-plane direction may be used. That is, the resonator substrate 51 is not limited to the AT-cut quartz crystal substrate, and may be a quartz crystal substrate other than the AT-cut quartz crystal substrate, such as an X-cut quartz crystal substrate, a Y-cut quartz crystal substrate, a Z-cut quartz crystal substrate, a BT-cut quartz crystal substrate, an SC-cut quartz crystal substrate, and an ST-cut quartz crystal substrate. In this embodiment, the resonator substrate 51 is formed from a quartz crystal, but the present disclosure is not limited thereto. For example, the resonator substrate 51 may be formed from a piezoelectric single crystal such as lithium niobate, lithium tantalate, lithium tetraborate, langasite, potassium niobate, gallium phosphate, or other piezoelectric single crystals. Further, the resonator element 5 is not limited to a piezoelectric-driven resonator element, and may be an electrostatic-driven resonator element using electrostatic force.

The resonator element 5 as described above is fixed to an upper surface of the base 4 by conductive bonding members B1 and B2 as shown in FIGS. 2, 3 and 4. The bonding member B1 electrically couples the internal terminal 441 included in the base 4 and the terminal 523 included in the resonator element 5, and the bonding member B2 electrically couples the internal terminal 451 included in the base 4 and the terminal 524 included in the resonator element 5.

The bonding members B1 and B2 are not particularly limited as long as they have both conductivity and bondability. For example, various metal bumps such as gold bumps, silver bumps, copper bumps, solder bumps, a conductive adhesive in which a conductive filler such as a silver filler is dispersed in various adhesives based on polyimide, epoxy, silicone and acrylic acid, or the like can be used. When the metal bumps are used as the bonding members B1 and B2, generation of gas from the bonding members B1 and B2 can be prevented, and an environmental change in the housing space S, in particular, an increase in pressure can be effectively prevented. On the other hand, when the conductive adhesive is used as the bonding members B1 and B2, the bonding members B1 and B2 are softer than the metal bumps, and a stress is hardly transmitted to the resonator element 5.

Above, an overall configuration of the resonance device 1 is briefly described. Next, a configuration of the recess 35 that is one of features of the resonance device 1 will be described in detail. As shown in FIG. 4, the recess 35 is a rectangle in a plan view, and in particular, in this embodiment, is a rectangle having the X axis as a longitudinal direction. Therefore, as shown in FIGS. 5 and 6, an inner surface of the recess 35 has four side surfaces 351 and a bottom surface 352. The inner surface of the recess 35 further has a connection surface 353 located between the side surfaces 351 and the bottom surface 352, and connecting these surfaces. The connection surface 353 is a curved surface having a curved concave surface in a cross-sectional view. Thus, by disposing the connection surface 353 of a curved surface between the side surface 351 and the bottom surface 352, no corner is formed between the side surface 351 and the bottom surface 352, and the stress concentration on the corresponding portion is reduced. Therefore, as in this embodiment, even if the lid 3 is formed of silicon whose mechanical strength is not so high, the resonance device 1 having sufficiently high mechanical strength is obtained. In addition, it is possible to prevent generation of a crack due to the stress concentration, a destruction of the airtightness of the housing space S for housing the resonator element 5, and a fluctuation in the frequency of the resonator element 5.

A boundary Q between the side surface 351 and the connection surface 353 is located above the resonator element 5, that is, on the bottom surface 352. In a portion where the connection surface 353 is formed, a width of the housing space S along the X axis and a width of the housing space S along the Y axis are reduced to an extent that the connection surface 353 inclines. Therefore, by disposing the connection surface 353 above the resonator element 5, a disposition space of the resonator element 5 can be prevented from being reduced, and the resonator element 5 can be disposed on the base 4 with a sufficient clearance between the resonator element 5 and the lid 3. However, the present disclosure is not limited thereto. For example, the boundary Q may be located below the resonator element 5.

In the connection surface 353, $L2>L1$, wherein $L1$ is a length along the Z axis which is a thickness direction of the lid 3, and $L2$ is a length along an axis orthogonal to the Z axis, that is, the X axis in FIG. 5, and the Y axis in FIG. 6. Accordingly, for example, compared with a case where $L2=L1$, stress dispersion efficiency is increased, and breakage of the lid 3 can be effectively prevented. Further, since a height of the connection surface 353 can be prevented as compared with a case of $L2<L1$, the miniaturization of the lid 3 can be achieved.

As shown in FIGS. 5 and 6, in this embodiment, the connection surface 353 satisfies $L2>L1$ on the entire periphery thereof, but only at least a part of the connection surface 353 needs to satisfy $L2>L1$. Further, $L2$ and $L1$ may be different between FIG. 5 and FIG. 6. In this case, $L2$ and $L1$ shown in FIG. 5 satisfy $L2>L1$, and $L2$ and $L1$ shown in FIG. 6 may satisfy $L2>L1$.

$0.02<L1/L3<0.2$, wherein $L3$ is a depth of the recess 35. Thus, the above stress dispersion effect can be sufficiently exhibited by setting $0.02<L1/L3$. On the other hand, enlargement of the package 2 can be effectively prevented by setting $L1/L3<0.2$. $0.05<L1/L3<0.15$ is more preferable, and $0.07<L1/L3<0.12$ is further more preferable. Accordingly, the above effect can be exhibited more remarkably. However, a relationship between $L1$ and $L3$ is not particularly limited.

Comparing a curvature radius $r1$ of the connection surface 353 at a first end P1 on a side surface 351 side, a curvature radius $r2$ thereof at a second end P2 on a bottom surface 352 side, and a curvature radius $r3$ thereof at a center portion P3, $r3<r1<r2$ is satisfied. The first end P1 and the second end P2 are connected by a continuous curved surface, the curvature radius gradually increases from the first end P1 toward the center portion P3, and similarly, the curvature radius gradually increases from the second end P2 toward the center portion P3. Thus, the above stress dispersion effect can be exhibited more remarkably by making the curvature radii different between the first end P1 and the second end P2. Further, overhanging of the connection surface 353 to the housing space S and a decrease in the housing space S can be prevented by making the curvature radius r3 at the center portion P3 smaller than the curvature radii r1 and r2 at the first and second ends P1 and P2.

The curvature radius r1 at the first end P1 is not particularly limited. However, for example, the curvature radius r1 is preferably 1 µm or more and 10 µm or less, more preferably 2 µm or more and 8 µm or less, and further preferably 3 µm or more and 7 µm or less. The connection surface 353 and the side surface 351 can be connected more smoothly by setting the curvature radius r1 in such a range. Therefore, a stress concentration at the boundary between the connection surface 353 and the side surface 351 can be effectively prevented. On the other hand, the curvature radius r2 at the second end P2 is not particularly limited. However, for example, the curvature radius r2 is preferably $2 \times 10^3$ µm or more and $3 \times 10^3$ µm or less, more preferably $2.2 \times 10^3$ µm or more and $2.8 \times 10^3$ µm or less, and further preferably $2.4 \times 10^3$ µm or more and $2.6 \times 10^3$ µm or less. The connection surface 353 and the bottom surface 352 can be connected more smoothly by setting the curvature radius r2 in such a range. Therefore, a stress concentration at a boundary between the connection surface 353 and the bottom surface 352 can be effectively prevented.

The length L1 of the connection surface 353 along the Z axis is not particularly limited, but is preferably a height of six scallops SC or more and a height of 14 scallops SC or less, for example. That is, $6 \leq L1/W \leq 14$ is preferable, wherein W is a width of one scallop SC. Accordingly, the length L1 of the connection surface 353 is appropriate, and the above stress dispersion effect can be effectively exhibited while preventing the enlargement of the lid 3. Here, an average value of widths of at least two or more scallops SC may be the width W, a width of a largest scallop SC may be the width W, or a width of a smallest scallop SC may be the width W.

In the boundary Q between the side surface 351 and the connection surface 353, the center portion is located closer to the bottom surface 352 than both ends of the side surface 351. In other words, a separation distance D1 between the boundary Q and the bottom surface 352 at the both ends of the side surface 351 is larger than a separation distance D2 between the boundary Q and the bottom surface 352 at the center portion of the side surface 351. That is, D1>D2. Thus, by making a distance between the boundary Q and the bottom surface 352 at both ends of the side surface 351 different from a distance between the boundary Q and the bottom surface 352 at the center portion of the side surface 351, the above stress dispersion effect can be effectively exhibited, and the resonance device 1 with higher mechanical strength is obtained. In particular, in this embodiment, the boundary Q is curved so as to be convex toward the bottom surface 352 side. Accordingly, the above effect can be exhibited more remarkably. However, the present disclosure is not limited thereto, D1 D2 may be satisfied.

The recess 35 is an etched recess formed by a "Bosch process" which is a kind of dry etching. The Bosch process is a technology for digging holes in silicon at a high aspect ratio by alternately supplying $SF_6$ as an etching gas and $C_4F_8$ as a sidewall protective film forming gas, and in manufacturing, as shown in FIG. 7, a plurality of minute concave portions called "scallop Sc" are continuously formed on the side surface 351 along the Z axis. An inner peripheral surface of the scallop SC is a curved surface, and a curvature radius r4 thereof is smaller than the curvature radius r1 at the first end P1. That is, r4<r1. Accordingly, the connection surface 353 can be a sufficiently gentle curved surface, and the above stress dispersion effect can be effectively exhibited. However, the present disclosure is not limited thereto, r4 r1 may be satisfied.

Above, the resonance device 1 is described. As described above, the resonance device 1 is formed of a semiconductor material or a glass material, and includes the lid 3, as the first substrate, having the recess 35 open in the lower surface 31 which is the first main surface, the base 4, as the second substrate, bonded to the lower surface 31 of the lid 3 and configured to close the opening of the recess 35, and the resonator element 5 housed in the recess 35. The inner surface of the recess 35 has the side surfaces 351, the bottom surface 352, and the connection surface 353 connecting the side surface 351 and the bottom surface 352. The connection surface 353 is a curved surface, and L1<L2, wherein L1 is the length along the Z axis as the first direction which is the thickness direction of the lid 3 of the connection surface 353, and L2 is the length in an X-Y plane as the second direction orthogonal to the Z axis. Thus, by disposing the connection surface 353 of a curved surface between the side surface 351 and the bottom surface 352, no corner is formed between the side surface 351 and the bottom surface 352, and the stress concentration on the corresponding portion is reduced. Therefore, as in this embodiment, even if the lid 3 is formed of silicon whose mechanical strength is not so high, the resonance device 1 having sufficiently high mechanical strength is obtained.

As described above, 0.02<L1/L3<0.2, wherein L3 is the depth along the Z axis of the recess 35. Thus, the above stress dispersion effect can be sufficiently exhibited by setting 0.02<L1/L3. On the other hand, the enlargement of the package 2 can be effectively prevented by setting L1/L3<0.2.

As described above, the recess 35 is a rectangle in the plan view, and the inner surface of the recess 35 has four side surfaces 351. In the boundary Q between the side surface 351 and the connection surface 353, the center portion is located closer to the bottom surface 352 than the both ends of the side surface 351. Thus, by making the distance between the boundary Q and the bottom surface 352 at the both ends of the side surface 351 different from the distance between the boundary Q and the bottom surface 352 at the center portion of the side surface 351, the above stress dispersion effect can be effectively exhibited, and the resonance device 1 with higher mechanical strength is obtained. In particular, in this embodiment, the boundary Q is curved so as to be convex toward the bottom surface 352. Accordingly, the above effect can be exhibited more remarkably.

As described above, the boundary Q between the side surface 351 and the connection surface 353 is located on the bottom surface 352 side than the resonator element 5. Accordingly, the disposition space of the resonator element 5 can be prevented from being reduced, and the resonator element 5 can be disposed on the base 4 with a sufficient clearance between the resonator element 5 and the lid 3.

As described above, the lid 3 has the upper surface 32 as the second main surface in the front-back relation with the lower surface 31, the outer peripheral surface 33 connecting the lower surface 31 and the upper surface 32, and the inclined surface 34 located between the upper surface 32 and the outer peripheral surface 33 and inclined with respect to the upper surface 32 and the outer peripheral surface 33. In other words, the corner between the upper surface 32 and the outer peripheral surface 33 is chamfered. Accordingly, the stress concentration on the corresponding portion is prevented and the mechanical strength of the lid 3 is increased.

As described above, the curvature radius r1 at the first end P1 on the side surface 351 side of the connection surface 353 is 1 μm or more and 10 μm or less, and the curvature radius r2 at the second end P2 on the bottom surface 352 side of the connection surface 353 is $2 \times 10^3$ μm or more and $3 \times 10^3$ μm or less. A space between the first end P1 and the second end P2 is a continuous curved surface. Accordingly, the side surface 351 and the bottom surface 352 can be more smoothly connected by the connection surface 353. Therefore, not only the stress concentration on the connection surface 353 but also the stress concentration on the boundary portion between the connection surface 353 and the side surface 351 or the boundary portion between the connection surface 353 and the bottom surface 352 can be effectively prevented.

As described above, the recess 35 is the etched recess formed by the dry etching, and the side surface 351 has a plurality of scallops SC formed by the dry etching. The curvature radius r1 of the connection surface 353 at the first end P1 is larger than the curvature radius r4 of the scallop SC. That is, r4<r1. Accordingly, the connection surface 353 can be a sufficiently gentle curved surface, and the above stress dispersion effect can be effectively exhibited.

Second Embodiment

Figure 8:
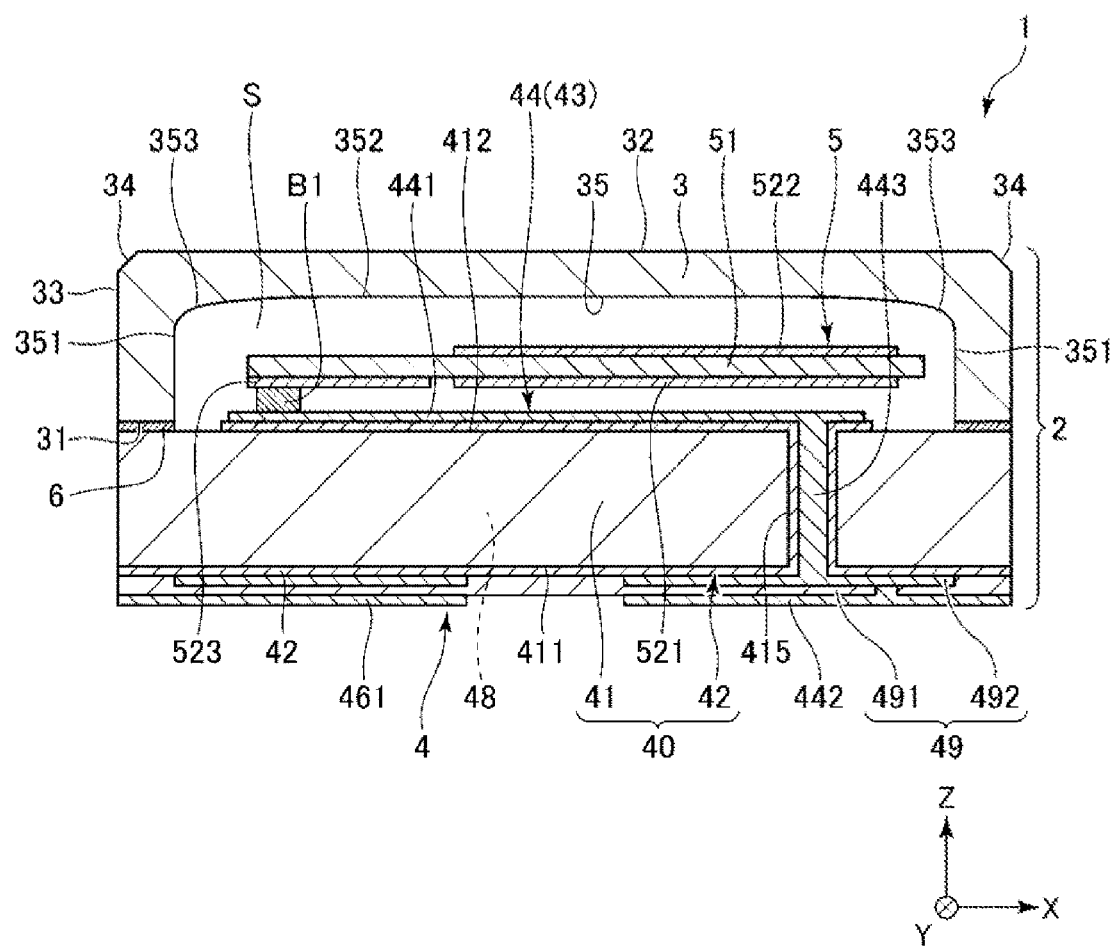
FIG. 8 is a cross-sectional view showing an oscillator according to a second embodiment.

FIG. 8 is a cross-sectional view showing an oscillator according to a second embodiment. FIG. 8 is a cross-sectional view corresponding to FIG. 2.

An oscillator 10 according to this embodiment is similar to the resonance device 1 according to the first embodiment except that an oscillation circuit 48 is formed on the base 4. In the following description, the resonance device 1 according to the second embodiment will be described focusing on differences from the first embodiment, and the description of similar matters will be omitted. In FIG. 8, the same reference numerals are given to a configuration similar to that of the above embodiment.

The oscillator 10 shown in FIG. 8 includes the oscillation circuit 48 formed on the base 4 and electrically coupled to the resonator element 5. In this embodiment, the lower surface 411 of the base substrate 41 is an active surface. On the lower surface 411 of the base substrate 41, a laminated body 49 in which an insulating layer 491 and a wiring layer 492 are laminated is provided, and a plurality of circuit elements (not shown) formed on the lower surface 411 are electrically coupled via the wiring layer 492 to constitute the oscillation circuit 48. Thus, by forming the oscillation circuit 48 on the base 4, a space of the base 4 can be effectively used.

Thus, the oscillator 10 includes the resonance device 1 and the oscillation circuit 48 electrically coupled to the resonator element 5 and configured to cause the resonator element 5 to oscillate. Therefore, the oscillator 10 can have the effect of the above resonance device 1, and can exhibit high reliability.

In this embodiment, the lower surface 411 of the base substrate 41 is the active surface, but the present disclosure is not limited thereto. The upper surface 412 of the base substrate 41 may be the active surface. By making the upper surface 412 of the base substrate 41 as the active surface, the electrical coupling between the resonator element 5 and the oscillation circuit 48 can have lower impedance, and the oscillator can be oscillated more stably. The oscillation circuit 48 may be formed separately from the base 4. In this case, the oscillation circuit 48 may be disposed in the housing space S or may be disposed outside the housing space S.

Third Embodiment

Figure 9:
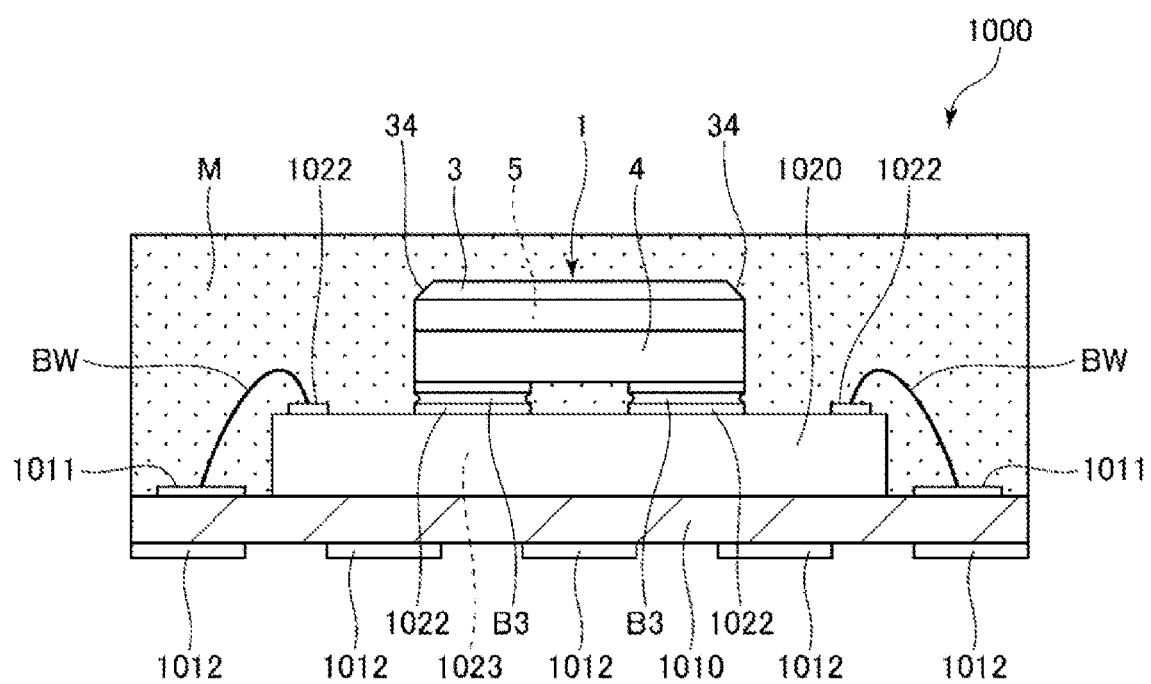
FIG. 9 is a cross-sectional view showing a resonance module according to a third embodiment.

FIG. 9 is a cross-sectional view showing a resonance module according to a third embodiment.

A resonance module 1000 shown in FIG. 9 includes a support substrate 1010, a circuit substrate 1020 mounted on the support substrate 1010, the resonance device 1 mounted on the circuit substrate 1020, and a molding material M for molding the circuit substrate 1020 and the resonance device 1.

The support substrate 1010 is, for example, an interposer substrate. A plurality of coupling terminals 1011 are disposed on an upper surface of the support substrate 1010, and a plurality of mounting terminals 1012 are disposed on a lower surface thereof. In addition, an internal wiring (not shown) is disposed in the support substrate 1010, and each coupling terminal 1011 is electrically coupled to a corresponding mounting terminal 1012 via the internal wiring. The support substrate 1010 as described above is not particularly limited, and for example, a silicon substrate, a ceramic substrate, a resin substrate, a glass substrate, or a glass epoxy substrate can be used.

The circuit substrate 1020 is bonded to the upper surface of the support substrate 1010 via a die attach material. On the circuit substrate 1020, an oscillation circuit 1023 for oscillating the resonator element 5 included in the resonance device 1 to generate a frequency of a reference signal such as a clock signal is formed, and a plurality of terminals 1022 electrically coupled to the oscillation circuit 1023 are disposed on an upper surface thereof. Some of the terminals 1022 are electrically coupled to the coupling terminals 1011 via bonding wires BW, and some of the terminals 1022 are electrically coupled to the resonance device 1 via, for example, conductive bonding members B3.

The molding material M molds the circuit substrate 1020 and the resonance device 1 to protect the circuit substrate 1020 and the resonance device 1 from moisture, dust, impact, or the like. Although the molding material M is not specifically limited, for example, a thermosetting epoxy resin can be used and the circuit substrate 1020 and the resonance device 1 can be molded by a transfer mold method.

Thus, the resonance module 1000 includes the resonance device 1, the circuit substrate 1020 as a module component on which the resonance device 1 is mounted, and the molding material M covering the resonance device 1. Therefore, the resonance module 1000 can have the effect of the above resonance device 1, and can exhibit excellent reliability. In particular, as described above, in the resonance device 1, the connection surface 353 is formed in the recess 35 of the lid 3, and the inclined surface 34 is formed on an outer periphery of the lid 3, so that the stress can be effectively dispersed. Therefore, the breakage of the resonance device 1 due to the stress applied during the molding can be effectively prevented.

Fourth Embodiment

Figure 10:
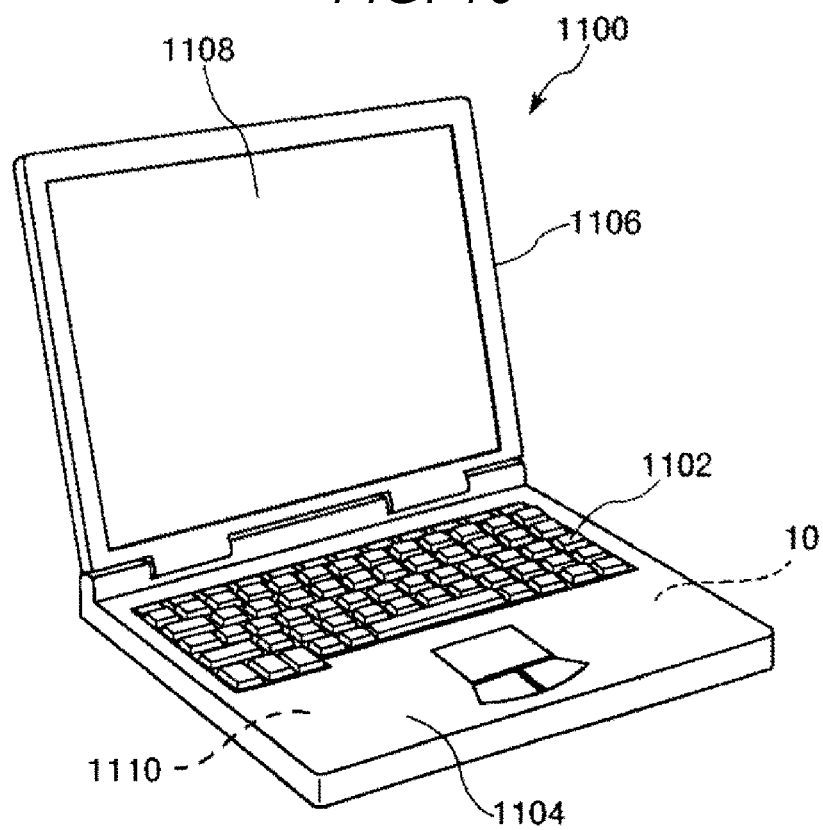
FIG. 10 is a perspective view showing a personal computer according to a fourth embodiment.

FIG. 10 is a perspective view showing a personal computer according to a fourth embodiment.

A personal computer 1100 as an electronic device shown in FIG. 10 includes a main body 1104 provided with a keyboard 1102 and a display unit 1106 provided with a display 1108. The display unit 1106 is rotatablely supported with respect to the main body 1104 via a hinge structure. The oscillator 10 is built in the personal computer 1100 described above. In addition, the personal computer 1100 includes an arithmetic processing circuit 1110 for performing an arithmetic processing related to a control over the keyboard 1102, the display 1108, or the like. The arithmetic processing circuit 1110 operates based on an oscillation signal output from the oscillator 10.

Thus, the personal computer 1100 as the electronic device includes the oscillator 10 and the arithmetic processing circuit 1110 operating based on the oscillation signal output from the oscillator 10. Therefore, the effect of the above oscillator 10 can be obtained and the high reliability can be exhibited.

Fifth Embodiment

Figure 11:
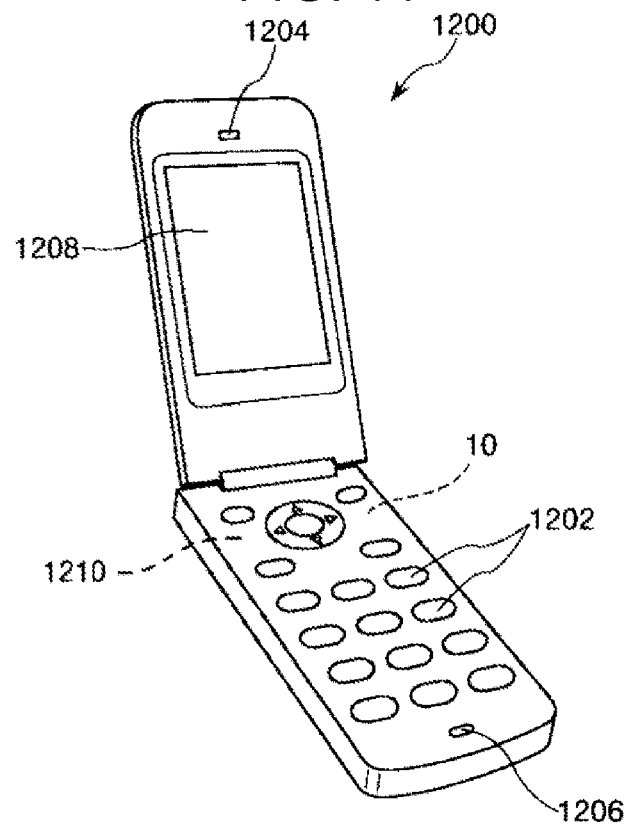
FIG. 11 is a perspective view showing a mobile phone according to a fifth embodiment.

FIG. 11 is a perspective view showing a mobile phone according to a fifth embodiment.

A mobile phone 1200 as an electronic device shown in FIG. 11 includes an antenna (not shown), a plurality of operation buttons 1202, an earpiece 1204, and a mouthpiece 1206, and a display 1208 is disposed between the operation button 1202 and the earpiece 1204. The oscillator 10 is built in the mobile phone 1200 described above. In addition, the mobile phone 1200 includes an arithmetic processing circuit 1210 for performing an arithmetic processing related to a control over the operation buttons 1202 or the like. The arithmetic processing circuit 1210 operates based on an oscillation signal output from the oscillator 10.

Thus, the mobile phone 1200 as the electronic device includes the oscillator 10 and the arithmetic processing circuit 1210 operating based on the oscillation signal output from the oscillator 10. Therefore, the effect of the above oscillator 10 can be obtained and the high reliability can be exhibited.

Sixth Embodiment

Figure 12:
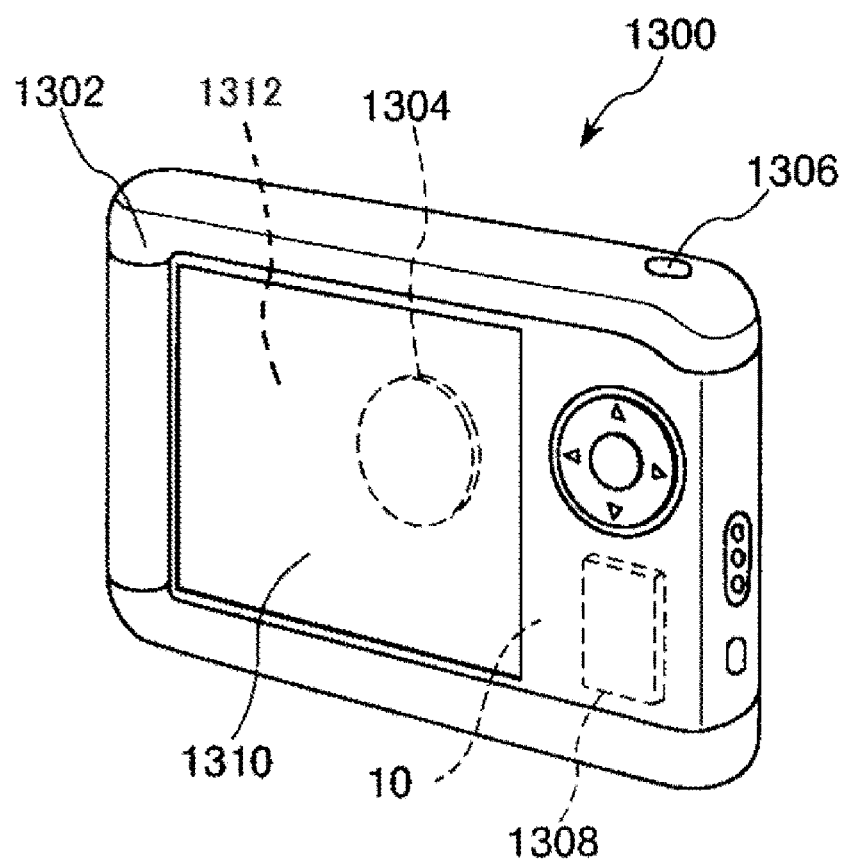
FIG. 12 is a perspective view showing a digital still camera according to a sixth embodiment.

FIG. 12 is a perspective view showing a digital still camera according to a sixth embodiment.

A digital still camera 1300 shown in FIG. 12 includes a body 1302, and a display 1310 for performing a display based on an imaging signal from a CCD is provided on a back surface of the body 1302. The display 1310 functions as a viewfinder for displaying a subject as an electronic image. In addition, a light receiving unit 1304 including an optical lens, the CCD or the like is provided on a front side (a back side in the figure) of the body 1302. When a photographer confirms a subject image displayed on the display 1310 and presses a shutter button 1306, a CCD imaging signal at that time is transmitted and stored in a memory 1308. For example, the oscillator 10 is built in the digital still camera 1300 described above. In addition, the digital still camera 1300 includes an arithmetic processing circuit 1312 for performing an arithmetic processing related to a control over the display 1310, the light receiving unit 1304, or the like. The arithmetic processing circuit 1312 operates based on an oscillation signal output from the oscillator 10.

Thus, the digital still camera 1300 as the electronic device includes the oscillator 10 and the arithmetic processing circuit 1312 operating based on the oscillation signal output from the oscillator 10. Therefore, the effect of the above oscillator 10 can be obtained and the high reliability can be exhibited.

In addition to the above personal computer, mobile phone, and digital still camera, the electronic device according to this application example can be applied to, for example, a smartphone, a tablet terminal, a clock (including a smart watch), an inkjet discharge device (for example, an inkjet printer), a desktop personal computer, a television, a wearable terminal such as a head mounted display (HMD), a video camera, a video tape recorder, a car navigation device, a pager, an electronic notebook (including one with a communication function), an electronic dictionary, a calculator, an electronic game device, a word processor, a workstation, a video phone, a TV monitor for crime prevention, an electronic binoculars, a POS terminal, a medical device (for example, an electronic thermometer, a blood pressure monitor, a blood glucose meter, an electrocardiogram measuring device, an ultrasonic diagnostic device, or an electronic endoscope), a fish finder, various measuring devices, a mobile terminal base station device, instruments (for example, instruments for a vehicle, an aircraft and a ship), a flight simulator, or a network server.

Seventh Embodiment

Figure 13:
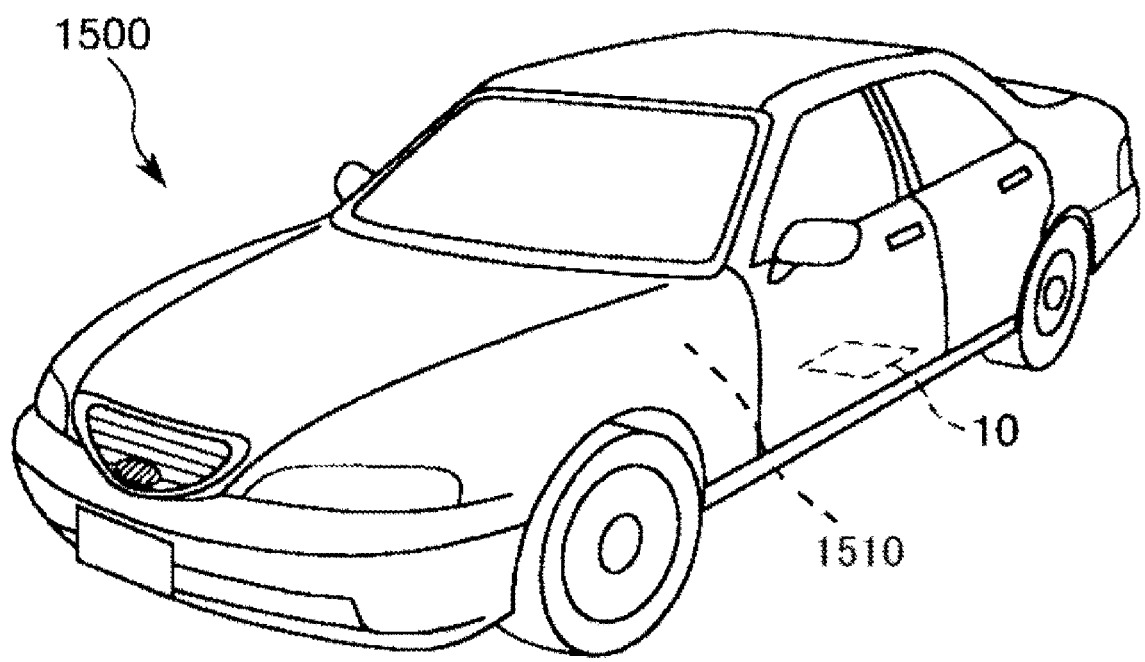
FIG. 13 is a perspective view showing an automobile according to a seventh embodiment.

FIG. 13 is a perspective view showing an automobile according to a seventh embodiment.

The oscillator 10 and an arithmetic processing circuit 1510 operating based on an oscillation signal output from the oscillator 10 are built in an automobile 1500 shown in FIG. 13. The oscillator 10 and the arithmetic processing circuit 1510 described above can be widely applied to, for example, a keyless entry, an immobilizer, a car navigation system, a car air conditioner, an anti-lock brake system (ABS), an airbag, a tire pressure monitoring system (TPMS), an engine control, a battery monitor for a hybrid or electric vehicle, and an electronic control unit (ECU) such as a vehicle body posture control system.

Thus, the automobile 1500 as a vehicle includes the oscillator 10 and the arithmetic processing circuit 1510 operating based on the oscillation signal output from the oscillator 10. Therefore, the effect of the above oscillator 10 can be obtained and the high reliability can be exhibited.

The vehicle is not limited to the automobile 1500, and can be applied to, for example, an airplane, a ship, an AGV (automated guided vehicle), a bipedal walking robot, or an unmanned aerial vehicle such as a drone.

Above, the resonance device, the oscillator, the resonance module, the electronic device, and the vehicle of the application example are described based on the illustrated embodiments, but this application example is not limited thereto, and a configuration of each part can be replaced with any configuration having a similar function. Other any components may be added to this application example. This application example may be a combination of any two or more configurations of the above embodiments.

What is claimed is:
1. A resonance device, comprising:
a first substrate formed of a semiconductor material or a glass material and having a recess which has an opening in a first main surface;
a second substrate bonded to the first main surface and configured to close the opening of the recess; and
a resonator element housed in the recess, wherein an inner surface of the recess has a side surface, a bottom surface, and a connection surface connecting the side surface and the bottom surface, the connection surface is a curved surface, $L1<L2$, L1 is a length of the connection surface in a first direction, and L2 is a length in a second direction orthogonal to the first direction, and the first direction is a thickness direction of the first substrate wherein the recess is a rectangle in a plan view, the side surface includes an end corresponding to a vertex of the rectangle, $1\ \mu m \leq r1 \leq 10\ \mu m$, $2 \times 10^5\ \mu m \leq r2 \leq 3 \times 10^5\ \mu m$, r1 is a curvature radius of the connection surface at a first end at a side surface side, r2 is a curvature radius of the connection surface at a second end at a bottom surface side, the connection surface between the first end and the second end is a continuous curved surface, the side surface includes a plurality of scallops formed by dry etching, and the curvature radius r1 is larger than a curvature radius of the scallop.

2. The resonance device according to claim 1, wherein $0.02<L1/L3<0.2$, and

L3 is a depth of the recess.

3. The resonance device according to claim 1, wherein $D1>D2$,

D1 is a distance between a boundary of the side surface and the connection surface and the bottom surface at the end, and D2 is a distance between the boundary and the bottom surface at a center portion of the side surface.

4. The resonance device according to claim 1, wherein a boundary of the side surface and the connection surface is closer to the bottom surface than is the resonator element.

5. The resonance device according to claim 1, wherein the first substrate includes:

a second main surface in a front-back relation with the first main surface;

an outer peripheral surface connecting the first main surface and the second main surface; and an inclined surface located between the second main surface and the outer peripheral surface and inclined with respect to the second main surface and the outer peripheral surface.

6. An oscillator, comprising:

the resonance device according to claim 1; and an oscillation circuit electrically coupled to the resonator element and configured to oscillate the resonator element.

7. An electronic device, comprising:

the oscillator according to claim 6; and an arithmetic processing circuit operating based on an oscillation signal output from the oscillator.

8. A vehicle, comprising:

the oscillator according to claim 6; and an arithmetic processing circuit operating based on an oscillation signal output from the oscillator.

9. A resonance module, comprising:

the resonance device according to claim 1;

a module component on which the resonance device is mounted; and a molding material covering the resonance device.

* * * * *